(12) United States Patent
Kordes et al.

(10) Patent No.: US 6,430,052 B1
(45) Date of Patent: Aug. 6, 2002

(54) TECHNIQUES FOR COOLING A CIRCUIT BOARD COMPONENT

(75) Inventors: Kurt A. Kordes, Pleasanton; John Mason, Hollister; Nghi Luu, San Jose, all of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/850,988

(22) Filed: May 8, 2001

(51) Int. Cl.$^7$ ................................................ H05F 7/20
(52) U.S. Cl. ........................ 361/719; 165/185; 257/733; 29/890.03
(58) Field of Search .......................... 156/87, 295, 499; 428/317.1, 317.7; 174/35 R, 252, 16.3; 165/80.3, 185; 257/706, 707, 713, 733; 361/690, 694, 695, 699, 700, 704, 705, 713, 717–719, 816, 818; 29/827, 832, 840, 842, 890.03

(56) References Cited

U.S. PATENT DOCUMENTS

| | | | |
|---|---|---|---|
| 4,607,685 A | * | 8/1986 | Mitchell, Jr. |
| 5,198,887 A | | 3/1993 | Brown ........................ 361/383 |
| 5,754,401 A | | 5/1998 | Saneinejad et al. ......... 361/705 |
| 5,875,545 A | * | 3/1999 | DiStefano et al. |
| 6,198,630 B1 | * | 3/2001 | Cromwell |
| 6,293,331 B1 | * | 9/2001 | Wang |
| 6,315,038 B1 | * | 11/2001 | Chiu |

OTHER PUBLICATIONS

TCM Thermal Reticle 32262, Research Disclosure, Kenneth Mason Publ, England, No. 322, Feb. 1991, one page.*

* cited by examiner

*Primary Examiner*—Gerald Tolin
(74) *Attorney, Agent, or Firm*—Chapin & Huang, L.L.C.; David E. Huang (57) ABSTRACT

A circuit board assembly has (i) a circuit board including a section of circuit board material and a circuit board component mounted to the section of circuit board material, (ii) a support assembly that supports the circuit board, and (iii) a heatsink that cools the circuit board component mounted to the circuit board. The heatsink includes a receptacle that fastens to the support assembly, and an adjustable member that engages with the receptacle. The adjustable member is movable relative to the receptacle in order to control a distance between the adjustable member and the circuit board component. The adjustable member can be positioned properly (e.g., with the correct pressure) for proper heat transfer therethrough. Moreover, circuit board assembly can include multiple heatsinks for cooling multiple circuit board components with the adjustable member of each heatsink being individually adjusted to accommodate any tolerance differences between the circuit board components.

24 Claims, 5 Drawing Sheets

TECHNIQUES FOR COOLING A CIRCUIT BOARD COMPONENT

BACKGROUND OF THE INVENTION

A typical circuit board includes a section of circuit board material (e.g., fiberglass, copper, vias, etc.) and circuit board components which are mounted to the section of circuit board material. Examples of circuit board components include integrated circuits (ICs), resistors, and inductors. Typically, these circuit board components generate heat during operation. A fan assembly typically generates an air stream that passes over the components and carries heat away. The air stream removes the heat so that the components do not operate in an unsafe temperature range, i.e., an excessively high temperature range that would cause the components to operate improperly (e.g., generate a signal incorrectly) or sustain damage (e.g., overheat, burnout, etc.).

Some ICs include heatsinks to facilitate cooling. In general, a heatsink is a flanged metallic device that attaches directly to the package of the IC. As the IC generates heat, heat flows from the IC package to the heatsink, and dissipates into the surrounding air. The air stream generated by the fan assembly then carries the heat away thus cooling the IC.

Some electronic enclosures (e.g., computer housings, boxes, towers, cabinets, etc.) or structures neighboring a circuit board provide limited space in the vicinity of the circuit board components. For example, the side of the circuit board on which the components mount may be close to a neighboring structure such as the side of the enclosure, the side of a card cage, the side of a neighboring circuit board, etc. In such situations, the open space around the circuit board components may be too small to allow an air stream provided by the fan assembly to adequately cool the components with or without conventional heatsinks. For such situations, alternative cooling approaches can be used.

One alternative approach to removing heat from circuit board components when space around the components is limited is called the heatpipe approach. A heatpipe is a device that moves heat using a process known as "vapor phase". A typical heatpipe includes an enclosed fluid pathway (e.g., a coil, a manifold, etc.). A portion of the fluid pathway is typically epoxied to the circuit board components. When the circuit board components (a heat source) heat up, fluid in that portion absorbs heat energy and changes from the liquid state to the gas state, i.e., the fluid boils. The vapor pressure forces the fluid (which is now the gas state) to a cooler portion of the pathway which is distal to the circuit board components. At this cooler portion, the fluid releases heat and condenses back into a liquid. That is, heat passes from the fluid into the cooler pathway walls and into the surrounding environment. The wicking action then sends the fluid (which is now back in the liquid state) back to the heat source portion of the pathway to absorb and carry away more heat in a cyclical manner.

Another alternative approach to removing heat from circuit board components when open space is limited is called the thermal transfer material approach. In this approach, thermal transfer material is placed between a circuit board component and a neighboring object such as the wall of an enclosure. The thermal transfer material conveys heat from the component to the neighboring object in order to dissipate the heat, via thermal conduction.

Yet another approach to removing heat from circuit board components when space around the components is limited is called the redesign approach. In this approach, the physical layout is modified (e.g., the enclosure is made larger, the circuit board components are moved away from neighboring structures, etc.) to permit a healthy air stream to adequately flow over the components and carry heat away.

SUMMARY OF THE INVENTION

Unfortunately, there are deficiencies to the above-described conventional approaches to cooling circuit board components when space in the vicinity of the circuit board components is limited. For example, in connection with the conventional heatpipe approach, heatpipe assemblies are typically very complex and require special handling in order to work properly (e.g., compared to heatsinks). Accordingly, heatpipes are prone to malfunction over time (e.g., a leak, etc.) due to their complexity. Additionally, when there is a problem (e.g., when the heatpipe fails, when a component epoxied to the heatpipe fails, etc.), the solution often involves removing the heatpipe from the components (e.g., ungluing the heatpipe from all components) which can cause other problems such as damage to a component that otherwise had functioned properly. Furthermore, the cost of heatpipe components (e.g., the tubing, the fluid, manufacturing costs, etc.) often makes the heatpipe approach prohibitively expensive. Also, depending on the board design and the geometry of the heatpipe, there could be adverse effects to electromagnetic interference (EMI) containment of the board since the heatpipe might act as an antenna.

Additionally, in the conventional thermal transfer material approach, the thermal transfer properties of the thermal transfer material are often affected by the pressure of the thermal transfer material on the circuit board components. That is, if the thermal transfer material is not pressed tightly enough between a circuit board component package and a neighboring structure (e.g., the wall of a card cage), the thermal transfer material will not convey heat properly from the component to the neighboring structure. Alternatively, if the thermal transfer material is pressed to tightly between the component and the neighboring structure, the mounting location of the component (e.g., the solder joints) can sustain damage causing the component to operate improperly. Unfortunately, the physical tolerances which dictate the distance between component and the neighboring structure may vary significantly and thus make this approach ineffective and problematic with some implementations not conveying enough heat due to too little pressure on the thermal transfer material, and some implementations damaging the component mounting locations due to too much pressure.

Furthermore, in the conventional redesign approach, the physical layout must be altered (e.g., increasing the size of an enclosure, providing more distance between a circuit board and a neighboring structure, etc.) to allow a healthy air stream to flow over the circuit board components. Such an approach is not always a practical option. In some situations, a particular application may require a small enclosure or close neighboring structures. For example, some computer equipment configurations may include circuit boards which are mounted to metal plates for EMI isolation (e.g., line card assemblies for a data communications device). Increasing the distance between the circuit boards and the metal plates on which they are mounted for each circuit board may be impractical due to size constraints. As another example, a mature design may call for an improvement by replacing one chipset with a higher-power, hotter-running chipset in order to obtain a cost/performance advantage over a competitor. In such a situation, the requirement of a redesign of the entire physical layout may be prohibitively expensive. Accordingly, there may be situations in which the redesign approach is impractical or unavailable.

In contrast to the above-described conventional approaches to cooling circuit board components, the present invention is directed to techniques for cooling a circuit board component mounted to a circuit board which uses a heatsink having a receptacle that fastens to a support assembly that supports the circuit board, and an adjustable member that engages the receptacle and is movable relative to the receptacle in order to control a distance between the adjustable member and the component. The heatsink can thus be moved to a position (e.g., in full contact with a circuit board component package, into contact with thermal transfer material that contacts the circuit board component package, etc.) which enables the heatsink to convey heat from the component to another structure such as the support assembly thus cooling the component during operation even if the component resides in a location where space is limited.

One arrangement is directed to a circuit board assembly which has (i) a circuit board including a section of circuit board material and a circuit board component mounted to the section of circuit board material, (ii) a support assembly that supports the circuit board, and (iii) a heatsink that cools the circuit board component mounted to the circuit board. The heatsink includes a receptacle that fastens to the support assembly, and an adjustable member that engages with the receptacle. The adjustable member is movable relative to the receptacle in order to control a distance between the adjustable member and the circuit board component. Accordingly, the adjustable member can be positioned properly (e.g., with the correct pressure) for proper heat transfer therethrough. Moreover, the circuit board assembly can include multiple heatsinks for cooling multiple circuit board components with the adjustable member of each heatsink being individually adjusted in a customized manner to accommodate any tolerance differences in the distances between the support assembly and the circuit board components.

In one arrangement, the receptacle of the heatsink defines an internally threaded surface. In this arrangement, the adjustable member defines an externally threaded surface such that the adjustable member threads within the receptacle and such that a distance between the adjustable member and the circuit board component varies as the adjustable member threads within the receptacle. Accordingly, the distance between the adjustable member and the circuit board component can be changed simply by threading the adjustable member within the receptacle (e.g., turning the adjustable member using a torque wrench).

In one arrangement, the receptacle includes a collar that defines the internally threaded surface of the receptacle, and an externally threaded surface. In this arrangement, the receptacle further includes a retaining nut that defines an internally threaded surface that corresponds to the externally threaded surface defined by the collar such that the retaining nut threads around the collar. Accordingly, the receptacle can be securely attached to the support assembly.

In one arrangement, the circuit board assembly further includes thermal transfer material disposed between the adjustable member and the circuit board or component. The thermal transfer material facilitates heat transfer between the circuit board or component (e.g., the top surface of the component) and the adjustable member (e.g., the top surface of the adjustable member).

In one arrangement, the circuit board assembly further includes an adhesive that holds the thermal transfer material to the adjustable member. The adhesive prevents the thermal transfer material from separating from the adjustable member prior to adjusting the adjustable member so that the thermal transfer material is held in place by friction between the component and the adjustable member.

In one arrangement, the thermal transfer material includes a first layer of phase-change material that contacts the adjustable member, a second layer of phase change material that contacts the circuit board component, and foil disposed between the first layer of phase-change material and the second layer of phase-change material. The foil improves the thermal transfer properties of the thermal transfer material.

In one arrangement, the adjustable member further defines a cavity to receive a torque wrench attachment. This enables a user to install the adjustable member in a consistent and easily repeatable manner.

In one arrangement, the adjustable member includes a metallic element. In this arrangement, the support assembly includes a section of sheet metal, and a set of standoffs that connect the section of sheet metal to the circuit board. In this arrangement, the metallic element and the section of sheet metal preferably form an EMI shield. Accordingly, circuitry within the circuit board component (as well as other circuitry on the circuit board) is protected against EMI which could otherwise cause improper operation.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for cooling a circuit board component mounted to a circuit board which uses a heatsink having a receptacle that fastens to a support assembly that supports the circuit board, and an adjustable member that engages the receptacle and is movable relative to the receptacle in order to control a distance between the adjustable member and the component. The heatsink can thus be moved to a position (e.g., in contact with a circuit board or component package, into contact with thermal transfer material that contacts the circuit board component package, etc.) which enables the heatsink to convey heat from the component to another structure such as the support assembly thus cooling the component during operation even if the component resides in a location where space is limited.

Figure 1:
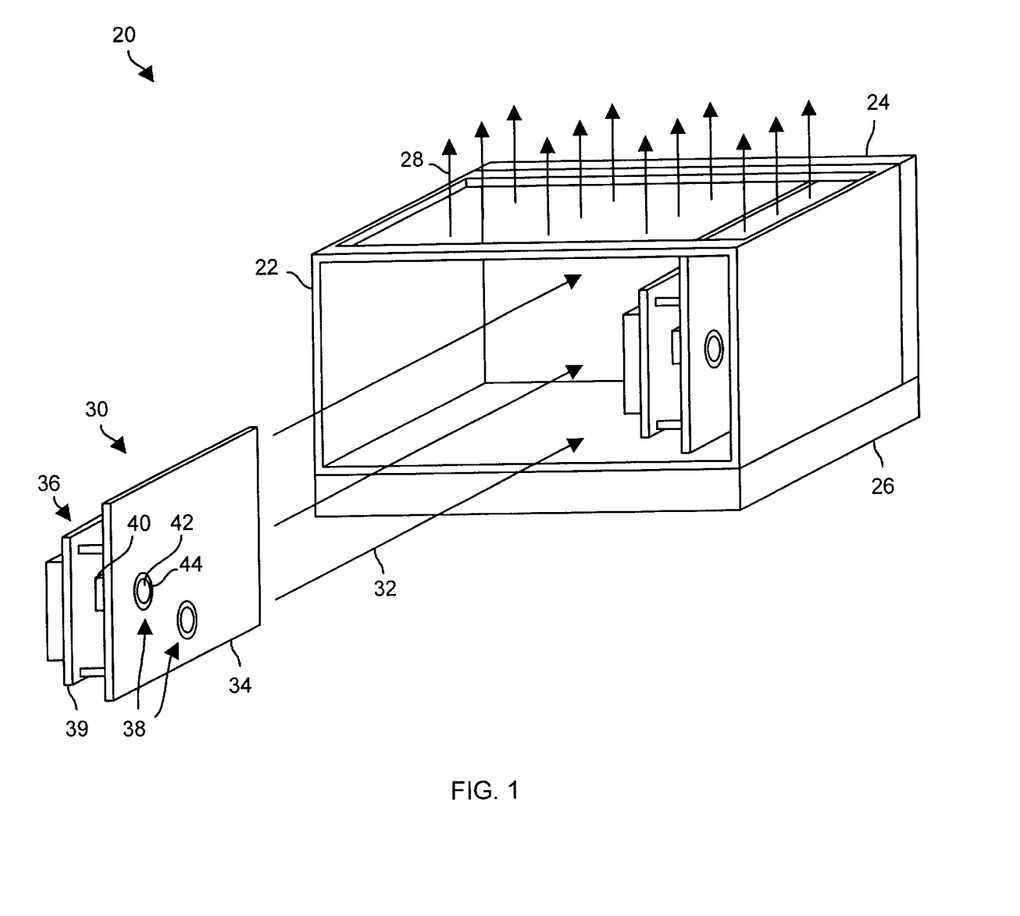
FIG. 1 is a perspective view of a computer system which is suitable for use by the invention.

FIG. 1 shows a computer system 20 which is suitable for use by the invention. The computer system 20 includes a card cage 22, a backplane 24, and a fan assembly 26 which provides an air stream 28 that flows through the card cage 22. The system 20 further includes multiple circuit board assemblies 30 which connect with the backplane 24 when installed in the card cage 22 in the direction 32.

Each circuit board assembly 30 includes a support assembly 34, a circuit board 36 and one or more heatsinks 38. In one arrangement, each support assembly 34 includes a side portion (shown in FIG. 1) and a front portion (not shown in FIG. 1 for simplicity but shown in FIG. 2) which is substantially perpendicular to that side portion. Each support assembly 34 essentially operates as a carrier for holding the circuit board 36 in place for proper alignment and connection with the backplane 24. In one arrangement, the support assembly 34 includes metallic material which shields circuitry of the circuit board assembly 30 from external EMI sources, as well as shields external circuitry from EMI generated by the circuitry of the circuit board assembly 30.

Each circuit board 36 includes a section of circuit board material 39 and one or more circuit board components 40 mounted thereon, e.g., ball grid array (BGA) components. Each heatsink 38 includes an adjustable member 42 and a receptacle 44 which holds that adjustable member 42.

It should be understood that the heatsink 38 facilitates cooling regardless of whether the space between the circuit board 36 and the support assembly 34 is large enough to support an air stream for adequate cooling of the components 40. For example, suppose that the space between the tops of the circuit board components 40 and the support assembly 34 is narrow (e.g., approximately 0.25 inches), the heatsink 38 conveys heat from a circuit board component 40 to another structure of the computer system 20 such as the support assembly 30 that supports the heatsink 38 in order to cool that component 40. In one arrangement, both the heatsink 38 and the other structure are made of material with high heat absorption characteristics (e.g., metal) so that heat from the circuit board component 40 transfers to the other structure through the heatsink 38. The air stream 28 provided by the fan assembly 26 carries the heat from the heatsink 38 and the other structure away from the component 40 in order to cool the component 40. In one arrangement, the heatsink 38 and the support assembly 34 include metallic material to form a continuous metallic plane that operates as an EMI shield or barrier.

As will now be discussed in further detail and with reference to FIGS. 2 and 3, the adjustable member 42 of each heatsink 38 is movable relative to the receptacle 44 of that heatsink 38 in order to control a distance between the adjustable member 42 and a circuit board component 40. Accordingly, the adjustable member 42 of each heatsink 38 can be positioned relative to a component 40 in a customized manner to assure proper heat transfer from the component 40 to the support assembly 34 through the heatsink 38.

Figure 2:
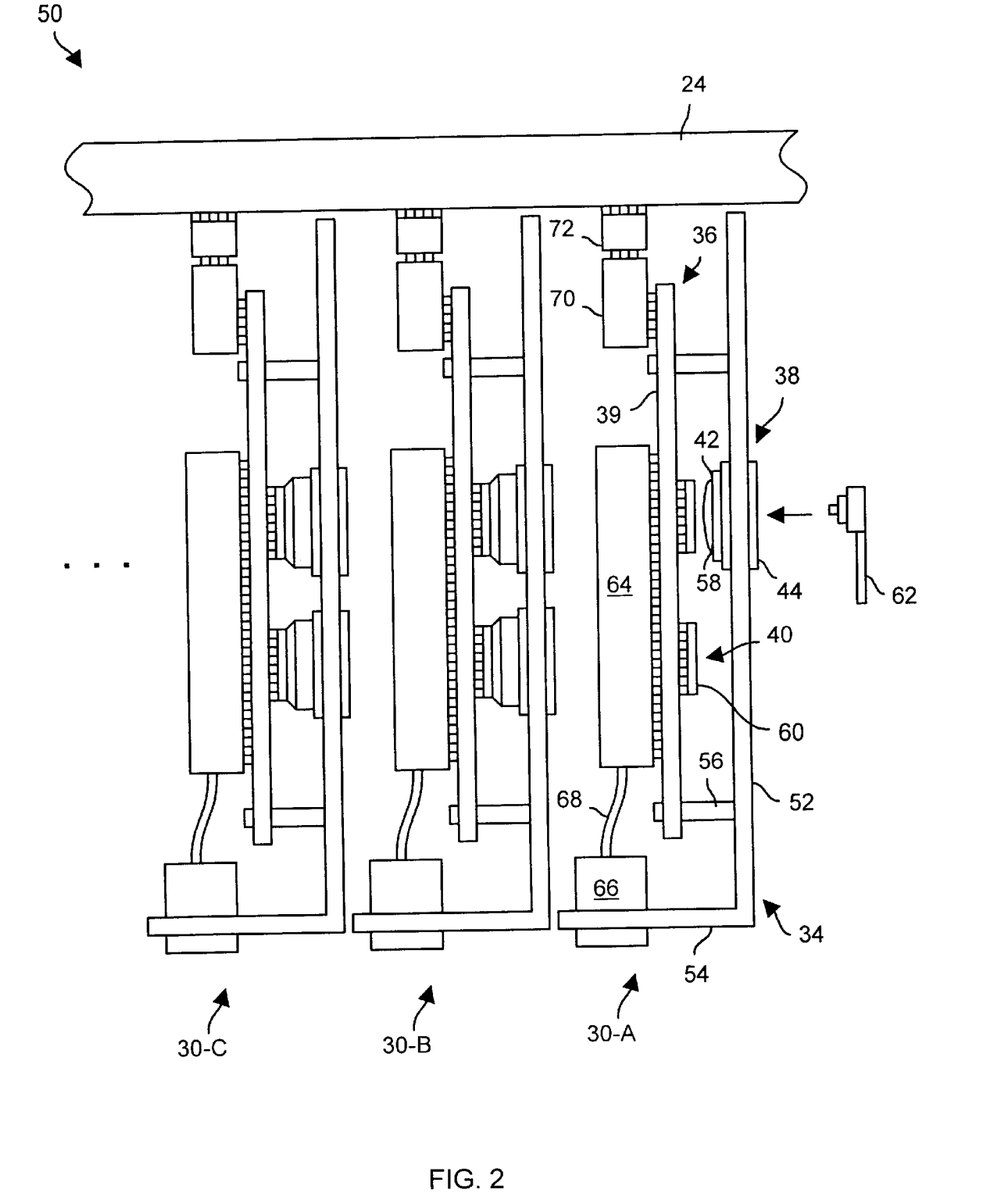
FIG. 2 is a top view of a portion of the computer system of FIG. 1 showing multiple circuit board assemblies and their heatsinks.

FIG. 2 shows a top view 50 of a portion of the computer system 20 of FIG. 1. Each circuit board assembly 30 includes a support member 34, a circuit board 36 and at least one heatsink 38, as mentioned earlier. By way of example only, each circuit board assembly 30 accommodates two heatsinks 38 for cooling two respective circuit board components 40. The heatsinks 38 of the circuit board assemblies 30-B and 30-C are completely installed. In contrast, one heatsink 38 of the circuit board assembly 30-A is partially installed and one heatsink 38 of the assembly 30-A has been omitted for illustration purposes only.

Each circuit board assembly 30 further includes a set of standoffs 56. The set of standoffs 56 connect the circuit board 36 to the support member 34. By way of example, the support member 34 is L-shaped and includes a side portion 52 and a front portion 54, and the set of standoffs 56 connect the section of circuit board material 39 of the circuit board 36 to the side portion 52 of the support member 34.

Each circuit board assembly 30 further includes thermal transfer material 58 which is disposed between a heatsink 38 and a circuit board component 40 corresponding to that heatsink 38. Initially, the thermal transfer material 58 is affixed (e.g., glued) to an adjustable member 42 of a heatsink 38. A user then moves the adjustable member 42 within a receptacle 44 of the heatsink 38 (e.g., threads the adjustable member 42 within the receptacle 44) so that the thermal transfer material 58 compresses against both the adjustable member 42 and a top surface 60 of a corresponding circuit board component 40. As a result, the thermal transfer material 58 is sandwiched between the adjustable member 42 and the component 40 and operates as a thermal conduit therebetween (see circuit board assemblies 30-B and 30-C).

In one arrangement, a user can move the adjustable members 42 using a torque wrench 62. In particular, in this arrangement, the adjustable members 42 are configured to receive a torque wrench attachment, and the user can turn the adjustable members 42 using the torque wrench 62. When the user exceeds a predetermined amount of torque when turning the torque wrench 62, the adjustable member 42 no longer tightens and no longer compresses the thermal transfer material 58 between a circuit board component 40 and the adjustable member 42. Rather, the torque wrench 62 spins thus preventing the user from overtightening the adjustable member 42 in a manner that could damage the mounting location of the circuit board component 40 (e.g., from providing too much pressure that could break solder joints between the component 40 and the circuit board 36). Accordingly, the torque wrench 62 allows the user to install the adjustable members 42 onto the thermal transfer material and the components 40 in a safe and consistent manner. The amount of torque provided by the torque wrench is preferably that which provides enough pressure for the thermal transfer material 58 to adequately transfer heat from the component 40 to the support assembly 34.

It should be understood that the circuit board assemblies 30 can further include a variety of circuit board structures. By way of example only, the circuit boards 36 of the circuit board assemblies 30 further include circuit board components 64 on an opposite side of the section of circuit board material 39. For instance, as shown in FIG. 2, the circuit boards 34 include fiber optic transducer modules 64 that convert between electrical and optical signals. A fiber optic cable 68 can connect each module 64 to a fiber optic connector 66 (or coupling) fastened to the front portion 54 of the support assembly 34. Additionally, the circuit boards 36 can include electrical connectors 70 which engage corresponding electrical connectors 72 of the backplane 24.

In one arrangement, the support assemblies 34 and the heatsinks 38 are both made of metallic material (e.g., sheet metal, anodized aluminum, etc.) to form a series of EMI shields. For example, the support assemblies 34 of the circuit board assemblies 30-A and 30-B enclose the circuitry of the circuit board assembly 30-A to provide EMI isolation (in conjunction with other structures such as the backplane 24) to the circuitry of the circuit board assembly 30-A (e.g., to form an EMI fence around the circuitry). Similarly, the support assemblies 34 of the circuit board assemblies 30-B and 30-C enclose the circuitry of the circuit board assembly 30-B to provide EMI isolation to the circuitry of the circuit board assembly 30-B, and so on. Without such EMI shielding, signals used by the circuitry (e.g., high speed electrical signals) could become corrupted causing data transfer errors, generation of incorrect signals, etc. Further details of the invention will now be provided with reference to FIG. 3.

Figure 3:
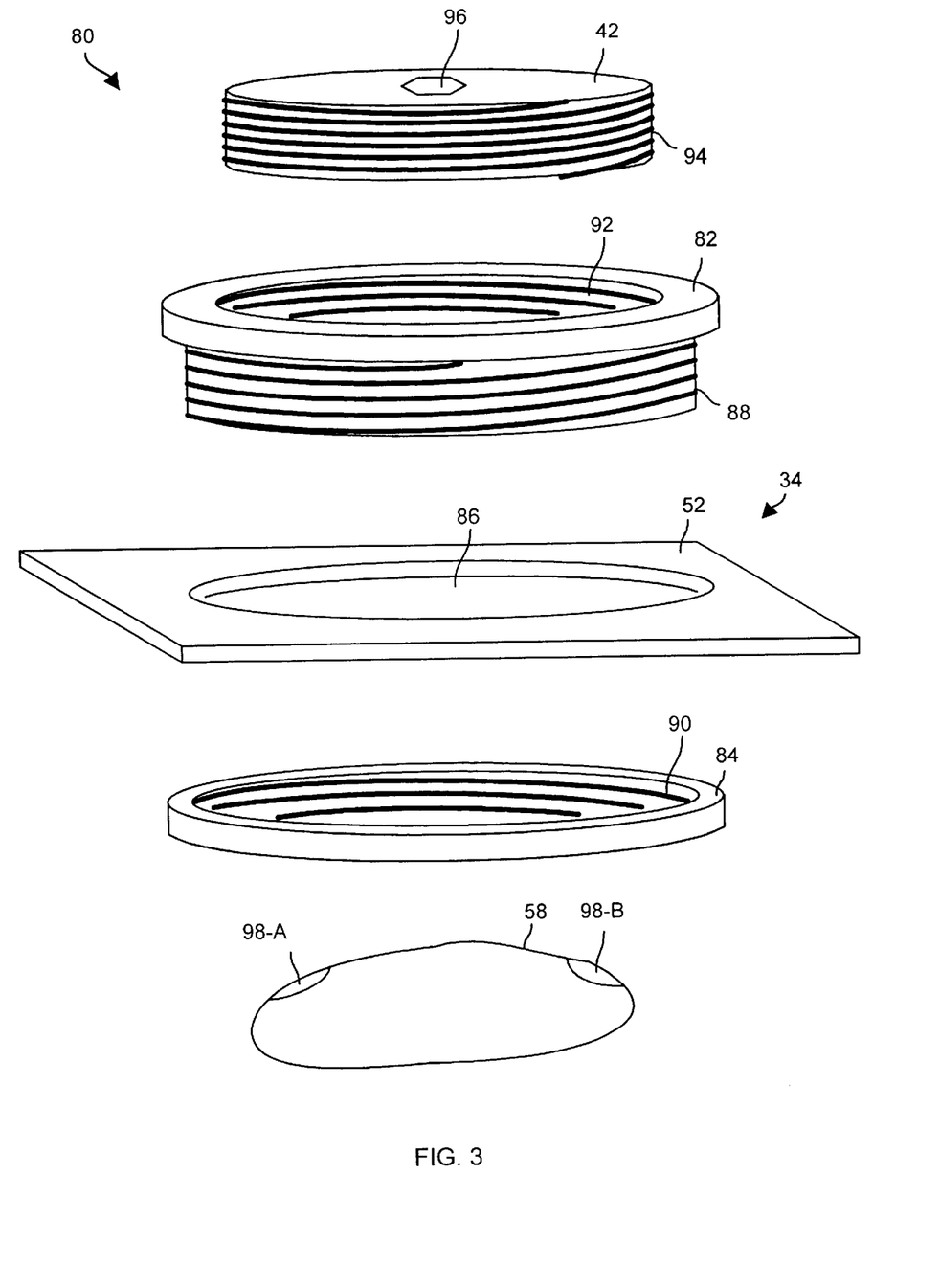
FIG. 3 is an exploded view of various components which form the heatsinks of FIG. 2.

FIG. 3 is an exploded view 80 of a heatsink 38. Also shown in FIG. 3 are part of the side portion 52 of the support assembly 34 and the thermal transfer material 58 which is eventually compressed between the adjustable member 42 and the top 60 of a circuit board component 40. The side portion 52 of the support assembly 34 defines a hole 86. The receptacle 44 of the heatsink 38 includes a collar 82 and a retaining nut (or ring) 84. That is, the collar 82 partially inserts through the hole 86 defined by the side portion 52, and the retaining nut 84 secures the collar 82 to the side portion 52. In one arrangement, the collar 82 defines an outer threaded surface 88, and the retaining nut 84 defines an inner threaded surface 90 such that the retaining nut 84 threads onto the collar 82.

As further shown in FIG. 3, the collar 82 further defines an inner threaded surface 92, and the adjustable member 42 defines an external threaded surface 94 such that the adjustable member 42 threads into the receptacle formed by the collar 82 and the retaining nut 84. Accordingly, the adjustable member 42 can move relative to the receptacle and the support assembly 34 simply by turning.

In one arrangement, the adjustable member 42 further defines a hole 96 (e.g., a hexagonal shaped cavity) into which a torque wrench attachment can fit (see the torque wrench 62 of FIG. 2). Accordingly, the adjustable member 42 can be turned within the receptacle (i.e., the collar 82) using a torque wrench for compressing the thermal transfer material 58 such that adequate pressure exists on the material 58 from both directions.

In one arrangement, the thermal transfer material 58 cannot adequately adhere to the adjustable member 42 without assistance at normal handling temperature (e.g., room temperature). In this arrangement, an adhesive 98 (e.g., adhesive portions 98-A and 98-B) attach the thermal transfer material 58 to the adjustable member 42 prior to final installation of the heatsink 38. In another arrangement, the thermal transfer material 58 has self-adhesion characteristics that are sufficient for it to stick onto the adjustable member 42 without assistance and the adhesive 98 is optional. Further details of the thermal transfer material 58 will now be provided with reference to FIG. 4.

Figure 4:
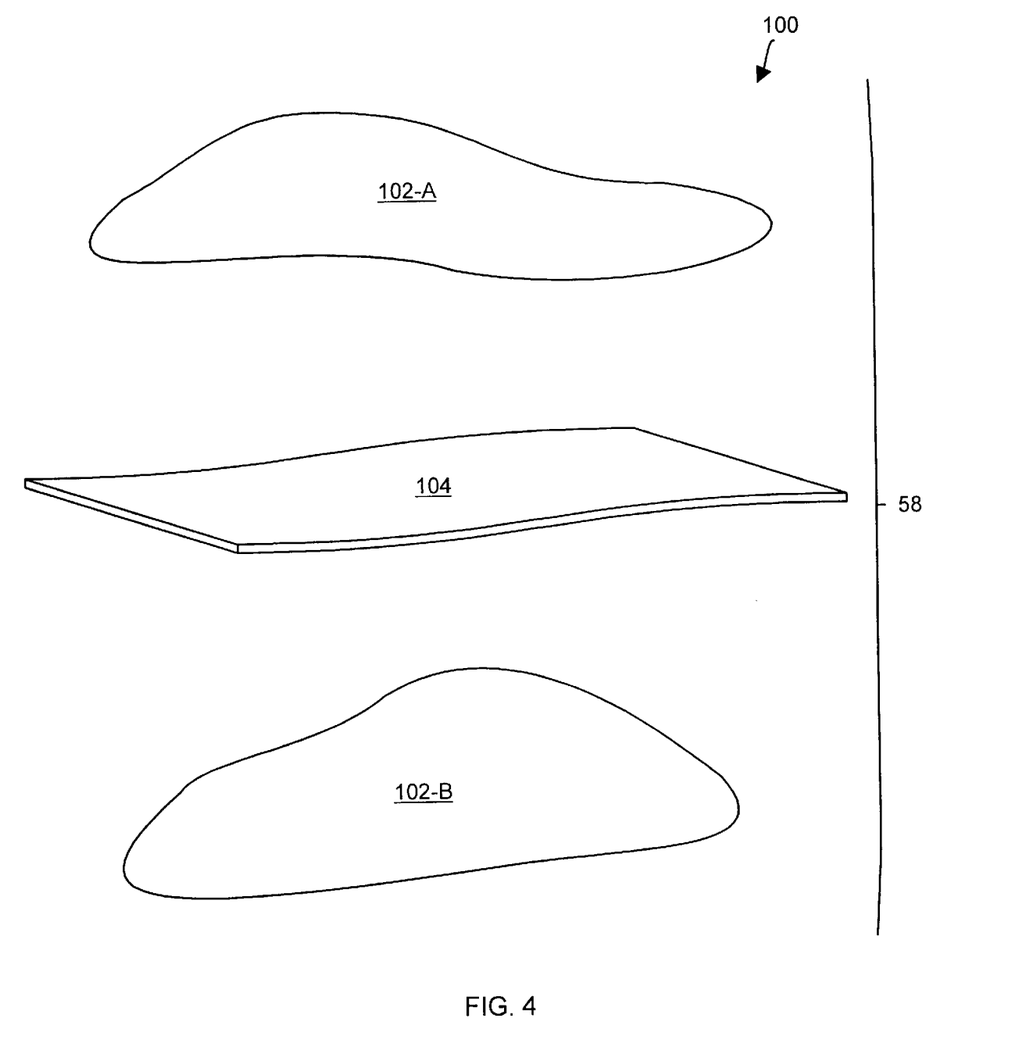
FIG. 4 is an exploded view of thermal transfer material which conveys heat between a heatsink and a circuit board component of a circuit board assembly of FIG. 2.

FIG. 4 shows an exploded view 100 of the thermal transfer material 58. As shown, the thermal transfer material 58 includes a first layer of phase-change material 102-A, the section of foil 104, and a second layer of phase-change material 102-B. The first and second layers of phase-change material 102-A, 102-B and the section of foil 104 compress together to form the sandwich configuration between a heatsink 38 and a circuit board component 40. Preferably, the foil 104 is aluminum (e.g., 0.0005, 0.0010 or 0.0020 inches thick) due to its favorable heat conduction properties. Preferably, the phase-change material 102-A, 102-B becomes soft and malleable in response to heat from a component 40 thus improving the thermal transfer characteristics through the thermal transfer material 58. Such softening also enables the material 58 to more evenly distribute itself between the component 40 and an adjustable member 42, and helps form a vacuum effect between the adjustable member 42 and the material 58 to better secure the material 58 in place. A substance which is suitable for use as the phase-change material 102-A, 102-B is Thermstrate 2000® which is manufactured and provided by Power Devices, Inc. of Laguna Hills, Calif.

Figure 5:
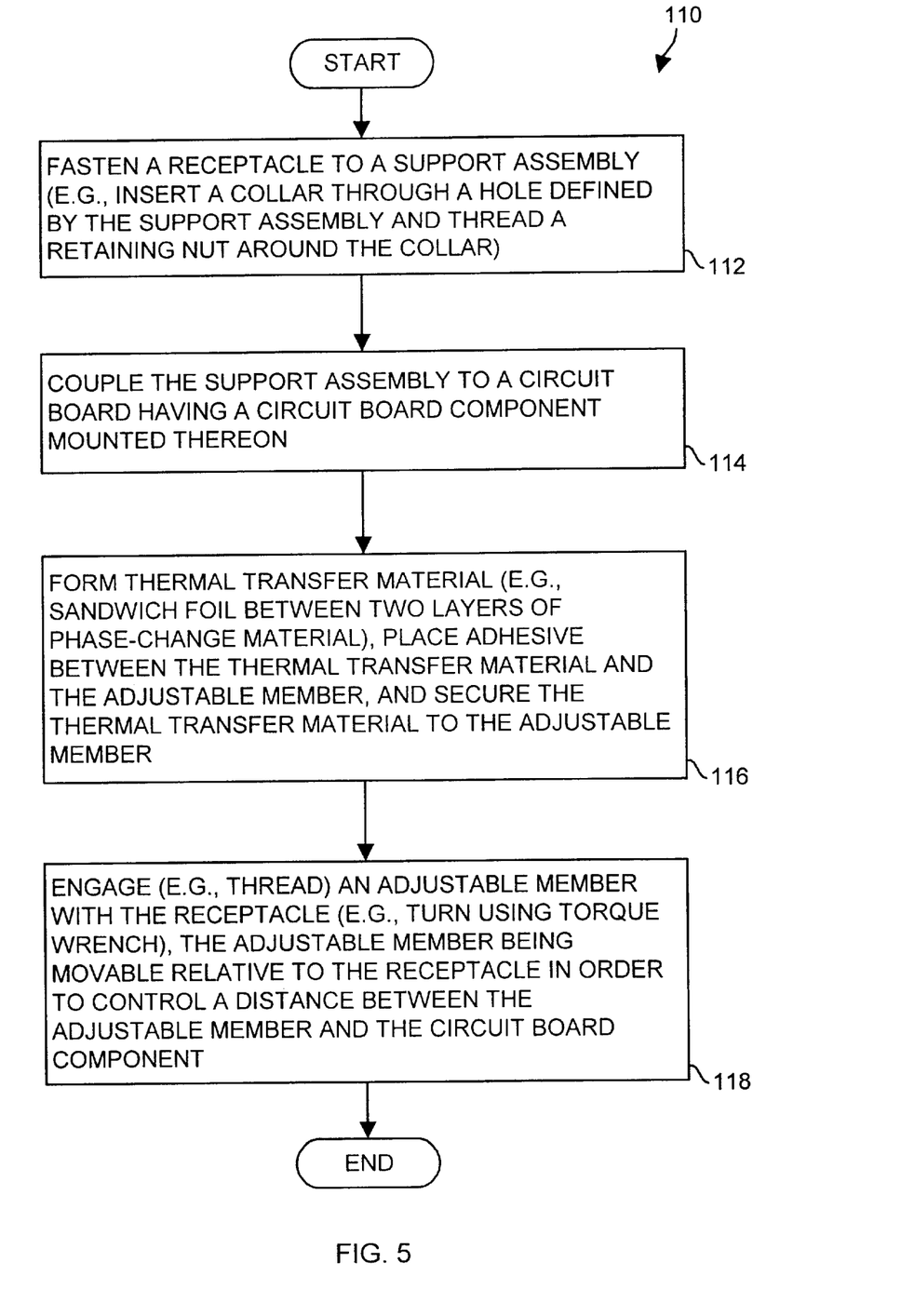
FIG. 5 is a flowchart of a procedure performed by a user of the computer system of FIG. 1.

FIG. 5 shows a flowchart of a procedure 110 performed by a user of the computer system 20 of FIG. 1 when adjusting a heatsink 38 to properly cool a circuit board component 40. In step 112, the user fastens the receptacle 44 to the support assembly 34. In particular, the user inserts the collar 82 through a hole 86 defined by the support assembly 34, and threads a retaining not 84 around the collar 82 (also see FIG. 3).

In step 114, the user couples the support assembly 34 to a circuit board 36 having a circuit board component 40 mounted thereon. During this step, the hole 86 defined by the support assembly 34 aligns over a top 60 of the component 40 (see FIG. 2).

In step 116, the user forms the thermal transfer material 58 (see FIG. 4), and attaches the thermal transfer material 58 to the adjustable member 42. In one arrangement, the user applies adhesive 98 to the thermal transfer material 58 to fasten the thermal transfer material 58 to the adjustable member 42 (see FIG. 3).

In step 118, the user engages the adjustable member 42 within the receptacle 44. This step positions the thermal transfer material 58 between the adjustable member 42 and the circuit board component 40. For example, the user turns the adjustable member 42 with in the receptacle 44 using a torque wrench. Accordingly, the user moves the adjustable member 42 relative to the receptacle 44 in order to control a distance between the adjustable member 42 and the circuit board component 40. Preferably, the user torques the adjustable member 42 such that a proper amount of pressure exists between the component 40 and the adjustable member 42 for adequate heat transfer through the thermal transfer material 58. Accordingly, when the computer system 20 is in operation, heat from the component 40 is conveyed to the support assembly 34 through the thermal transfer material 58.

As described above, the invention is directed to techniques for cooling a circuit board component 40 mounted to a section of circuit board material 39. The techniques use a heatsink 38 having a receptacle 44 that fastens to a support assembly 34 that supports the circuit board section 39, and an adjustable member 42 that engages the receptacle 44 and is movable relative to the receptacle 44 in order to control a distance between the adjustable member 42 and the component 40. As a result, the heatsink 38 can be moved to a position which enables the heatsink 38 to convey heat from the component 40 to another structure such as the support assembly 34 thus cooling the component 40 during operation even if the component 40 resides in a location where space is limited.

The use of the above-described techniques avoids the need for more complex and expensive conventional approaches such as heatpipes which are prone to damage and require maintenance, and use of thermal transfer material by itself which is difficult to compress without a delivery mechanism such as the threaded adjustable member 42 and a torque wrench 60 (see FIG. 2). Furthermore, the computer system 20 can maintain a low profile which is advantageous when implementing the invention on existing low profile designs or in new designs which require a low profile. The techniques of the invention, as described above, may be employed in equipment and procedures such as those of Cisco Systems of San Jose, Calif.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the support member 34 was described above as being L-shaped by way of example only. Other configurations are suitable for use by the invention as well. For example, the support member 34 can simply be a flat section of sheet metal, the side of an enclosure (e.g., a cabinet), or other neighboring structures onto which the receptacle 44 can fasten.

Additionally, it should be understood that the receptacle was described above as having the form of a collar 82 which is held in place by a retaining nut 84 by way of example only. In other arrangements, a receptacle 44 defining the inner threaded surface 90 is mounted to the support assembly 34 using other mechanisms such as being welded to the support assembly 34 or being bolted to the support assembly 34. In one arrangement, the support assembly 34 is routed so that the receptacle and the support assembly 34 are essentially a unitary body.

Furthermore, it should be understood that the thermal transfer material 58 is used to facilitate heat transfer but in some situations may be unnecessary. For example, in some situations, the adjustable member 42 can be torqued directly onto the top of a component for direct contact. Such contact can be sufficient to convey heat from the component to the support assembly 34 through the heatsink 38.

Additionally, it should be understood that each circuit board assembly 30 was described as including two heatsinks 38 by way of example only. Other numbers of heatsinks 38 can be used as well depending on the number and location of circuit board components 40 to be cooled, and the circuit board assemblies 30 can be different from each other and include different numbers of heatsinks 38 and different circuit board components 40.

Furthermore, it should be understood that a single heatsink 38 can be used to cool more than one component 40. For example, a single heatsink 38 can contact two components 40 and convey heat away from both of those components 40 simultaneously.

Additionally, in addition to the support assemblies 30, the heatsinks 38 can contact other structures of the computer system 20. For example, a heat sink 38 can be physically supported by the support assembly 34 and contact both a component 40 and a neighboring structure having high heat absorption characteristics (e.g., a neighboring metal chassis) in order to convey heat from the component 40 to both the support assembly 34 and the neighboring structure.

Furthermore, it should be understood that other improvements and enhancements can be made to the system 20 of FIG. 1. For example, the support assembly 34 can be embossed around the holes 86 (see FIG. 3) so that the receptacle 44 sits flush with the surface of the side portion 52 rather than protrude from the surface of the side portion 52.

As another example, the various components of the heatsink 38 (e.g., the collar 82, etc.) can be de-burred and coated (e.g., with clear or black anodized zinc) to remove potentially harmful burrs (e.g., sources of circuit board contamination and shorts), to make the heatsink 38 more aesthetically pleasing, and to electrically insulate the heatsink 38.

Furthermore, it should be understood that the adjustable member 42 was described as being movable using a torque wrench 62 by way of example only. Other tools are suitable for moving the adjustable member 42, e.g., a socket wrench, alien wrench, screw driver, etc. Preferably, the hole 96 defined by the adjustable member 42 is shaped to receive the particular tool to be used.

Alternatively, the adjustable member 42 can define one or more features that enable a user to move the adjustable member 42 without the use of a tool. For example, the adjustable member 42 can define one or more protrusions, (e.g., similar to a thumbscrew) that allow a user to hand-tighten the adjustable member 42. As another example, the adjustable member 42 can define one or more indentations, or a textured surface, which allows the user to hand-tighten the adjustable member 42. Such enhancements and improvements are intended to be part of the invention.

What is claimed is:

1. A circuit board assembly, comprising:
   a circuit board including a section of circuit board material and a circuit board component mounted to the section of circuit board material;
   a support assembly that connects directly to the circuit board, the support assembly including:
      a heatsink support member, and
      a set of connecting members which connects the heatsink support member directly to the circuit board; and
   a heatsink that cools the circuit board component mounted to the circuit board, the heatsink including:
      a receptacle that fastens to the heatsink support member of the support assembly, and
      an adjustable member that engages with the receptacle, the adjustable member being movable relative to the receptacle in order to control a distance between the adjustable member and the circuit board component.

2. The circuit board assembly of claim 1 wherein the adjustable member is substantially cylindrical in shape, wherein the receptacle defines an opening, and wherein the adjustable member is configured such that a widest portion of the adjustable member is capable of engaging the receptacle at the opening defined by the receptacle.

3. The circuit board assembly of claim 2 wherein the receptacle defines an internally threaded surface, and wherein the widest portion of the adjustable member defines an externally threaded surface which enables the adjustable member to thread within the receptacle in order to engage the receptacle.

4. The circuit board assembly of claim 1 wherein the heatsink support member provides a substantially planar surface.

5. The circuit board assembly of claim 1 wherein the circuit board component mounts to a mounting surface of the section of circuit board material, and wherein the heatsink support member has a surface area that is greater than that of the mounting surface of the section of circuit board material.

6. The circuit board assembly of claim 1, further comprising:
   another heatsink that fastens to the support assembly and that cools another circuit board component mounted to the circuit board such that multiple heatsinks operate to cool multiple circuit board components mounted to the circuit board.

7. The circuit board assembly of claim 1 wherein the receptacle of the heatsink defines an internally threaded surface, and wherein the adjustable member defines an externally threaded surface such that the adjustable member threads within the receptacle and such that a distance between the adjustable member and the circuit board component varies as the adjustable member threads within the receptacle.

8. The circuit board assembly of claim 7 wherein the adjustable member further defines a cavity to receive a torque wrench attachment.

9. The circuit board assembly of claim 1, further comprising:
thermal transfer material disposed between the adjustable member and the circuit board component.

10. The circuit board assembly of claim 9, further comprising:
an adhesive that holds the thermal transfer material to the adjustable member.

11. A heatsink for cooling a circuit board component mounted to a circuit board, the heatsink comprising:
a receptacle that fastens to a support assembly which is capable of coupling to the circuit board; and
an adjustable member that engages the receptacle, the adjustable member being movable relative to the receptacle in order to control a distance between the adjustable member and the circuit board component when the support assembly couples to the circuit board, wherein the receptacle defines an internally threaded surface, and wherein the adjustable member defines an externally threaded surface such that the adjustable member threads within the receptacle and such that, when the support assembly couples to the circuit board, a distance between the adjustable member and the circuit board component varies as the adjustable member threads within the receptacle, and wherein the receptacle includes:
a collar that defines the internally threaded surface of the receptacle, and an externally threaded surface; and
a retaining nut that defines an internally threaded surface that corresponds to the externally threaded surface defined by the collar such that the retaining nut threads around the collar.

12. A circuit board assembly, comprising:
a circuit board including a section of circuit board material and a circuit board component mounted to the section of circuit board material;
a support assembly that supports the circuit board; and
a heatsink that cools the circuit board component mounted to the circuit board, the heatsink including:
a receptacle that fastens to the support assembly; and
an adjustable member that engages with the receptacle, the adjustable member being movable relative to the receptacle in order to control a distance between the adjustable member and the circuit board component,
wherein the receptacle of the heatsink defines an internally threaded surface, wherein the adjustable member defines an externally threaded surface such that the adjustable member threads within the receptacle and such that a distance between the adjustable member and the circuit board component varies as the adjustable member threads within the receptacle, and wherein the receptacle includes:
a collar that defines the internally threaded surface of the receptacle, and an externally threaded surface; and
a retaining nut that defines an internally threaded surface that corresponds to the externally threaded surface defined by the collar such that the retaining nut threads around the collar.

13. A circuit board assembly, comprising:
a circuit board including a section of circuit board material and a circuit board component mounted to the section of circuit board material;
a support assembly that supports the circuit board; and
a heatsink that cools the circuit board component mounted to the circuit board, the heatsink including:
a receptacle that fastens to the support assembly; and
an adjustable member that engages with the receptacle, the adjustable member being movable relative to the receptacle in order to control a distance between the adjustable member and the circuit board component,
wherein the receptacle of the heatsink defines an internally threaded surface, wherein the adjustable member defines an externally threaded surface such that the adjustable member threads within the receptacle and such that a distance between the adjustable member and the circuit board component varies as the adjustable member threads within the receptacle, and wherein the thermal transfer material includes:
a first layer of phase-change material that contacts the adjustable member;
a second layer of phase change material that contacts the circuit board component; and
foil disposed between the first layer of phase-change material and the second layer of phase-change material.

14. A circuit board assembly, comprising:
a circuit board including a section of circuit board material and a circuit board component mounted to the section of circuit board material;
a support assembly that supports the circuit board; and
a heatsink that cools the circuit board component mounted to the circuit board, the heatsink including:
a receptacle that fastens to the support assembly; and
an adjustable member that engages with the receptacle, the adjustable member being movable relative to the receptacle in order to control a distance between the adjustable member and the circuit board component,
wherein the receptacle of the heatsink defines an internally threaded surface, wherein the adjustable member defines an externally threaded surface such that the adjustable member threads within the receptacle and such that a distance between the adjustable member and the circuit board component varies as the adjustable member threads within the receptacle, and wherein the adjustable member includes a metallic element, and wherein the support assembly includes:
a section of sheet metal; and
a set of standoffs that connect the section of sheet metal to the circuit board, the metallic element and the section of sheet metal forming an electromagnetic interference shield.

15. A circuit board assembly, comprising:
a circuit board including a section of circuit board material and a circuit board component mounted to the section of circuit board material;
a support assembly that connects directly to the circuit board, the support assembly including:
a section of sheet metal, and
a set of connecting members which supports the section of sheet metal such that the section of sheet metal is out of contact with the circuit board component; and
a heatsink that cools the circuit board component mounted to the circuit board, the heatsink including:
a receptacle that fastens to the section of sheet metal of the support assembly, and
an adjustable member that engages with the receptacle, the adjustable member being movable relative to the receptacle in order to control a distance between the adjustable member and the circuit board component.

16. The circuit board assembly of claim 15 wherein the receptacle of the heatsink defines an internally threaded surface, and wherein the adjustable member defines an externally threaded surface such that the adjustable member threads within the receptacle and such that a distance between the adjustable member and the circuit board component varies as the adjustable member threads within the receptacle.

17. The circuit board assembly of claim 16 wherein the adjustable member further defines a cavity to receive a torque wrench attachment.

18. The circuit board assembly of claim 15, further comprising:

thermal transfer material disposed between the adjustable member and the circuit board component.

19. The circuit board assembly of claim 18, further comprising:

an adhesive that holds the thermal transfer material to the adjustable member.

20. The circuit board assembly of claim 15 wherein the adjustable member is substantially cylindrical in shape, wherein the receptacle defines an opening, and wherein the adjustable member is configured such that a widest portion of the adjustable member is capable of engaging the receptacle at the opening defined by the receptacle.

21. The circuit board assembly of claim 20 wherein the receptacle defines an internally threaded surface, and wherein the widest portion of the adjustable member defines an externally threaded surface which enables the adjustable member to thread within the receptacle in order to engage the receptacle.

22. The circuit board assembly of claim 15 wherein the section of sheet metal of the support assembly provides a substantially planar surface.

23. The circuit board assembly of claim 15 wherein the circuit board component mounts to a mounting surface of the section of circuit board material, and wherein the section of sheet metal has a surface area that is greater than that of the mounting surface of the section of circuit board material.

24. The circuit board assembly of claim 15, further comprising:

another heatsink that fastens to the support assembly and that cools another circuit board component mounted to the circuit board such that multiple heatsinks operate to cool multiple circuit board components mounted to the circuit board.

* * * * *